(12) United States Patent
Kim et al.

(10) Patent No.: US 8,233,334 B2
(45) Date of Patent: Jul. 31, 2012

(54) CODE ADDRESS MEMORY (CAM) CELL READ CONTROL CIRCUIT OF SEMICONDUCTOR MEMORY DEVICE AND METHOD OF READING DATA OF CAM CELL

(75) Inventors: Kyoung Nam Kim, Gyeonggi-do (KR); Beom Ju Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 79 days.

(21) Appl. No.: 12/650,980

(22) Filed: Dec. 31, 2009

(65) Prior Publication Data

US 2010/0302827 A1    Dec. 2, 2010

(30) Foreign Application Priority Data

May 29, 2009    (KR) .................. 10-2009-0047814

(51) Int. Cl.
*G11C 7/00* (2006.01)
(52) U.S. Cl. .................................. 365/189.15
(58) Field of Classification Search .......... 365/244, 365/94, 189.15
See application file for complete search history.

(56) References Cited

U.S. PATENT DOCUMENTS

| | | | |
|---|---|---|---|
| 6,285,222 B1 * | 9/2001 | Kitade | 327/143 |
| 2005/0010885 A1 * | 1/2005 | Aipperspach et al. | 716/6 |
| 2008/0313418 A1 * | 12/2008 | Kwon et al. | 711/166 |
| 2009/0244054 A1 * | 10/2009 | Lee et al. | 345/213 |
| 2010/0142241 A1 * | 6/2010 | Ahn | 365/49.1 |
| 2010/0157683 A1 * | 6/2010 | Nguyen | 365/185.18 |

FOREIGN PATENT DOCUMENTS

KR    1020030002706    1/2003

OTHER PUBLICATIONS

Notice of Allowance issued from Korean Intellectual Property Office on Jun. 17, 2011.

\* cited by examiner

*Primary Examiner* — Hoai V Ho
*Assistant Examiner* — Min Huang
(74) *Attorney, Agent, or Firm* — IP & T Group LLP

(57) ABSTRACT

A Code Address Memory (CAM) cell read control circuit of a semiconductor memory device includes a CAM cell read circuit configured to read data stored in a CAM cell and to output the read data, an internal delay circuit configured to delay an externally input reset signal and to generate a number of internal command signals, and a signal generation unit configured to generate an internal ready/busy signal in response to the internal command signals. The internal ready/busy signal is generated after the externally input reset signal has reset the CAM cell read circuit.

7 Claims, 3 Drawing Sheets

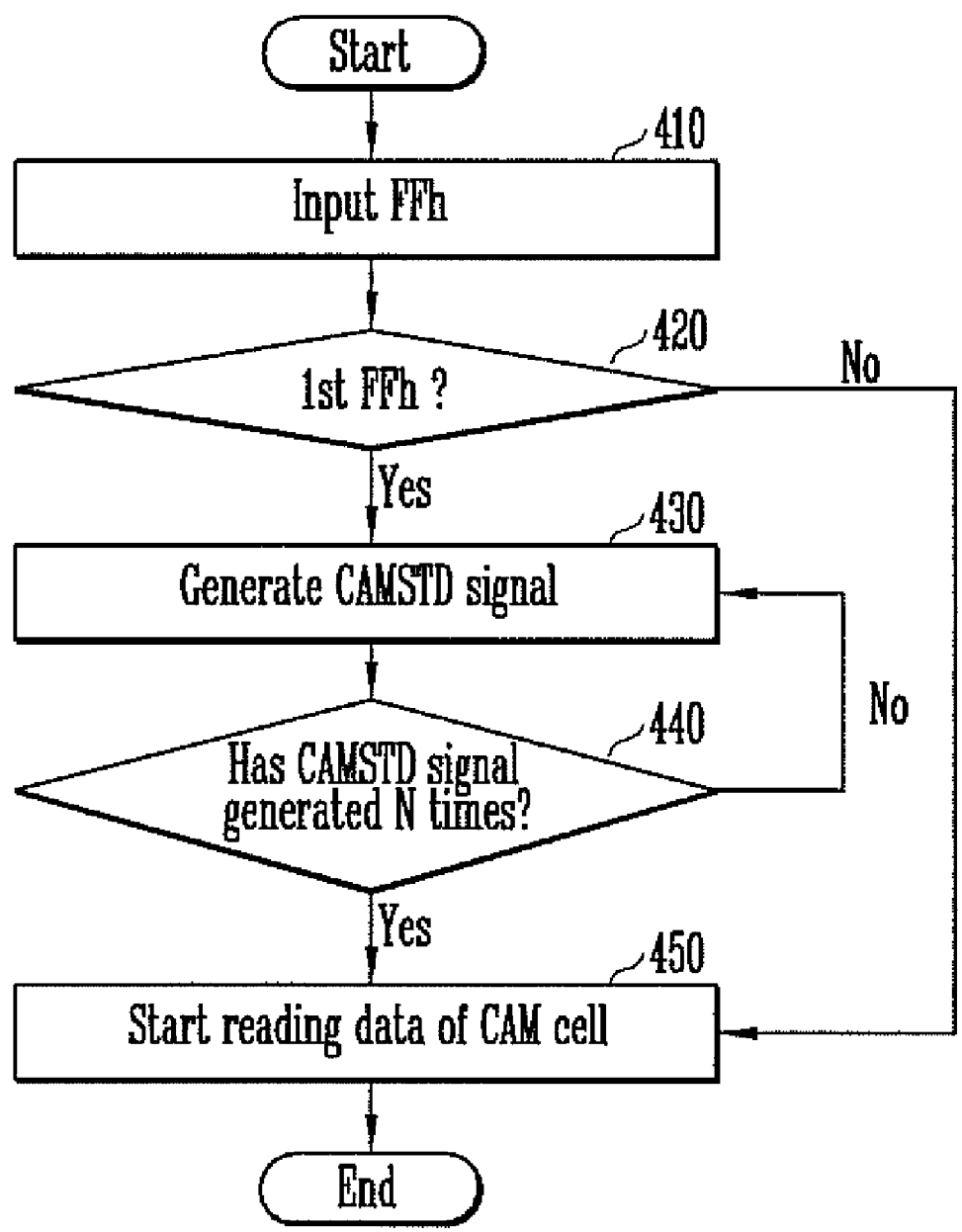

ns. The embodiment is provided so that those of ordinary skill in the art to which the present invention pertains can easily carry out the technical spirit of the present invention.

CODE ADDRESS MEMORY (CAM) CELL READ CONTROL CIRCUIT OF SEMICONDUCTOR MEMORY DEVICE AND METHOD OF READING DATA OF CAM CELL

CROSS-REFERENCE TO RELATED APPLICATIONS

Priority to Korean patent application number 10-2009-0047814 filed on May 29, 2009, the entire disclosure of which is incorporated by reference herein, is claimed.

BACKGROUND OF THE INVENTION

An embodiment of the present invention relates to a Code Address Memory (hereinafter referred to as a 'CAM') cell read control circuit of a semiconductor memory device and a method of reading data stored in a CAM cell and, more particularly, to a CAM cell read control circuit of a semiconductor memory device and a method of reading data stored in a CAM cell, which performs a stable reset operation even when an unstable power supply voltage is initially supplied to the device.

The repair construction of a conventional flash memory device includes groups of registers, and each of the register groups stores information regarding one respective redundant column. If the number of redundant columns increases, the number of register groups also increases.

In the repair construction, one register group includes a CAM unit configured to store a flag indicating whether a corresponding redundant column has been used, the address of a column in which an error has occurred, and I/O information. The CAM unit includes a CAM cell configured to store data and a latch circuit configured to read and latch data stored in the CAM cell.

In an operation of reading data stored in the CAM cell, when a power supply voltage is supplied to a device and a ready/busy signal R/B is shifted, a reset command is inputted, and the data reading operation is performed in response to the reset command. In the conventional method of reading data stored in the CAM cell, a stable reading operation of the data of the CAM cell can be performed only when an initially supplied power supply voltage is rapidly raised to a voltage level higher than a set voltage level. If the power-up time is slow, the data stored in the CAM cell can be erroneously read, resulting in a malfunction.

SUMMARY OF THE INVENTION

An embodiment of the present invention relates to a CAM cell read control circuit of a semiconductor memory device and a method of reading data stored in a CAM cell, which correctly reads data stored in a CAM cell even when an initially supplied power supply voltage is slowly raised upon the device being first operated.

A CAM cell read control circuit of a semiconductor memory device according to an embodiment of the present invention includes an internal delay circuit configured to delay an externally input reset signal and to generate a number of internal command signals, and a signal generation unit configured to generate an internal ready/busy signal in response to the internal command signals. The internal ready/busy signal resets a CAM cell read circuit.

The internal delay circuit includes a number of delay circuits. The delay circuits are configured to receive the externally input reset signal and to generate the internal command signals with different respective delay times.

The internal delay circuit includes a first delay circuit configured to generate a first internal command signal in response to the externally input reset signal and a first feedback signal, a second delay circuit configured to generate a second internal command signal in response to the first internal command signal and a second feedback signal, and a third delay circuit configured to generate a third internal command signal in response to the second internal command signal and a third feedback signal.

The first delay circuit includes a first decoder configured to generate the first internal command signal in response to the externally input reset signal and the first feedback signal, and a first delay unit configured to delay the first internal command signal and to output the first feedback signal.

The second delay circuit includes a second decoder configured to generate the second internal command signal in response to the first internal command signal and the second feedback signal, and a second delay unit configured to delay the second internal command signal and to output the second feedback signal.

The third delay circuit includes a third decoder configured to generate the third internal command signal in response to the second internal command signal and the third feedback signal, and a third delay unit configured to delay the third internal command signal and to output the third feedback signal.

A method of reading data stored in a CAM cell of a semiconductor memory device according to another embodiment of the present invention includes: determining whether an externally input reset signal is a first externally input reset signal, delaying the externally input reset signal and generating an internal command signal if the externally input reset signal is determined to be a first externally input reset signal, generating the internal command signal again to increase a number of times that the internal command signal has been generated upon the number of times that the internal command signal has been generated being less than a set number of times, generating an internal ready/busy signal to reset a CAM cell read circuit upon the number of times that the internal command signal has been generated being equal to the set number of times, and reading data stored in a CAM cell using the CAM cell read circuit.

The process returns to resetting the CAM cell read circuit upon the externally input reset signal being determined not to be the first externally input reset signal.

The internal ready/busy signal is generated after a set delay time period after the externally input reset signal has been inputted.

BRIEF DESCRIPTION OF THE DRAWINGS

FIG. 4 is a flowchart illustrating a method of reading a CAM cell of a semiconductor memory device according to an embodiment of the present invention.

DESCRIPTION OF THE INVENTION

Figure 1:
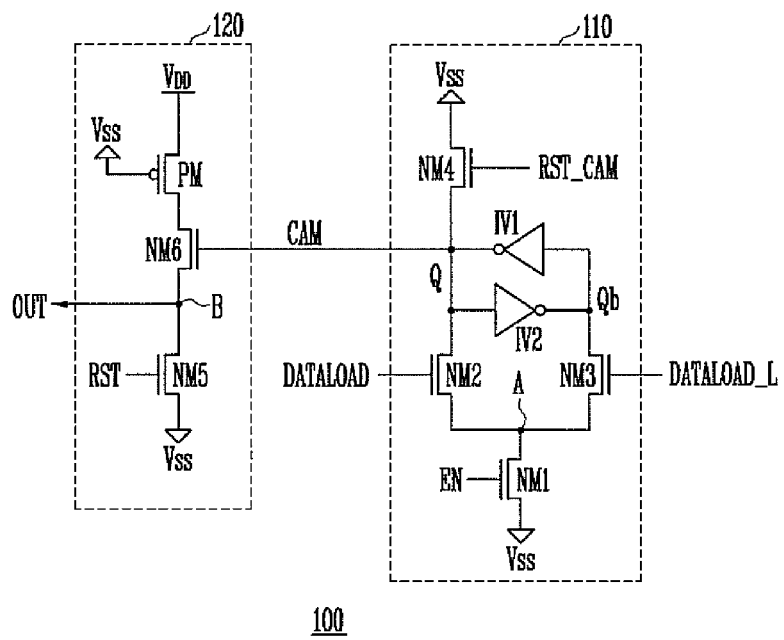
FIG. 1 is a detailed circuit diagram of a CAM cell read circuit 100 of a semiconductor memory device.

Hereinafter, an embodiment of the present invention is described in detail with reference to the accompanying drawings. The drawing figures are provided to allow those having ordinary skill in the art to understand the scope of the embodiment of the present invention.

FIG. 1 is a detailed circuit diagram of a CAM cell read circuit 100 of a semiconductor memory device.

Referring to FIG. 1, the CAM cell read circuit 100 includes a CAM cell latch unit 110 and a CAM cell data output unit 120.

The CAM cell latch unit 110 includes a number of NMOS transistors NM1 to NM4 and inverters IV1 and IV2.

The NMOS transistor NM1 is coupled between a node A and a ground voltage Vss and is configured to supply the ground voltage Vss to the node A in response to an enable signal EN.

The inverters IV1 and IV2 are coupled in parallel between a node Q and a node Qb in a reverse direction to each other, thus forming a latch structure.

The NMOS transistors NM2 and NM3 are respectively coupled between the node Q and the node A and between the node Qb and the node A. The NMOS transistors NM2 and NM3 latch data, corresponding to a data value stored in a CAM cell, in the latch consisting of the inverters IV1 and IV2 in response to respective data load signals DATALOAD and DATALOAD_L corresponding to the data value stored in the CAM cell.

The NMOS transistor NM4 is coupled between the node Q and the ground voltage Vss and is configured to reset the latch by supplying the node Q with the ground voltage Vss in response a CAM reset signal RST_CAM.

The CAM cell data output unit 120 includes a PMOS transistor PM and NMOS transistors NM5 and NM6.

The PMOS transistor PM and the NMOS transistors NM5 and NM6 are coupled in series between a power supply voltage $V_{DD}$ and the ground voltage Vss. The PMOS transistor PM has a gate supplied with the ground voltage Vss and supplies the power supply voltage $V_{DD}$. The NMOS transistor NM5 is configured to reset an output node B to a low level in response to a reset signal RST. The NMOS transistor NM6 is configured to control the voltage level of the output node B in response to latch data CAM which corresponds to CAM cell data outputted from the node Q of the CAM cell latch unit 110. Accordingly, the CAM cell data output unit 120 outputs CAM cell output data OUT in response to the latch data CAM.

Figure 2:
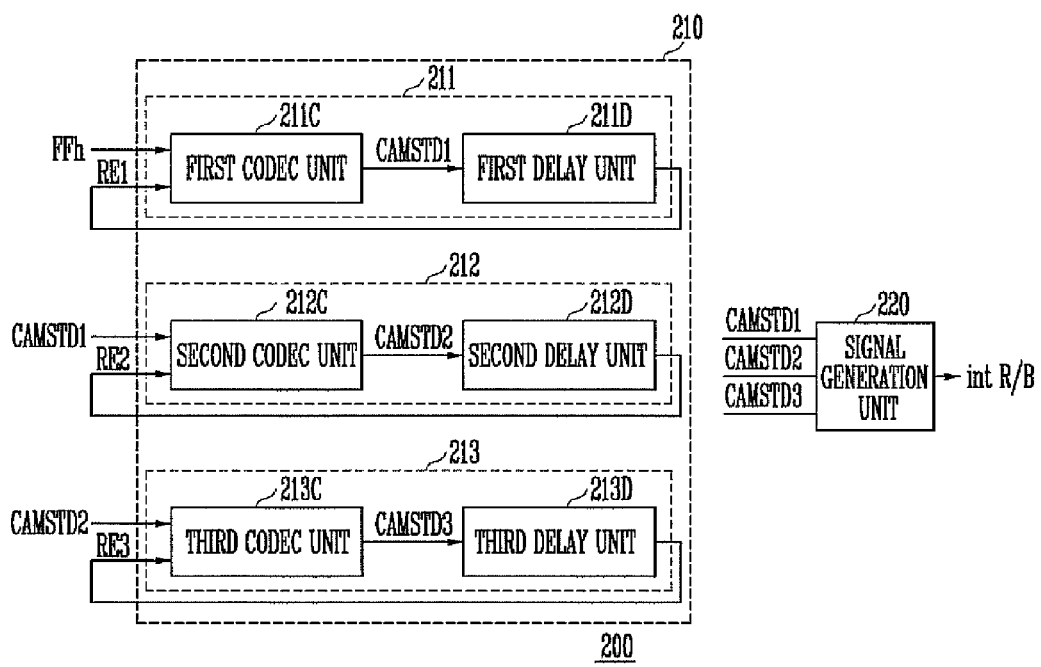
FIG. 2 a detailed block diagram showing a detailed construction of a CAM cell read control circuit 200 according to an embodiment of the present invention.

FIG. 2 is a detailed block diagram of a CAM cell read control circuit 200 according to an embodiment of the present invention.

Referring to FIG. 2, the CAM cell read control circuit 200 includes an internal delay circuit 210 and a signal generation unit 220. The internal delay circuit 210 is configured to delay an externally input reset signal FFh and to generate a number of internal command signals CAMSTD1 to CAMSTD3. The signal generation unit 220 is configured to generate an internal ready/busy signal int R/B in response to the internal command signals CAMSTD1 to CAMSTD3.

The internal delay circuit 210 includes a number of delay circuits 211 to 213. Although only the three delay circuits are illustrated as an example in this embodiment of the present invention, additional delay circuits can be added in order to control the delay time.

The delay circuits 211 to 213 have the same construction. The delay circuit 211 includes a first codec unit 211C and a first delay unit 211D. The first codec unit 211C is configured to generate the first internal command signal CAMSTD1 in response to the externally input reset signal FFh and a first control signal RE1 (i.e., the output signal of the first delay unit 211D). The first delay unit 211D is configured to delay the first internal command signal CAMSTD1 and to generate the first control signal RE1.

The delay circuit 212 includes a second codec unit 212C and a second delay unit 212D. The second codec unit 212C is configured to generate the second internal command signal CAMSTD2 in response to the first internal command signal CAMSTD1 and a second control signal RE2 (i.e., the output signal of the second delay unit 212D). The second delay unit 212D is configured to delay the second internal command signal CAMSTD2 and to generate the second control signal RE2.

The delay circuit 213 includes a third codec unit 213C and a third delay unit 213D. The third codec unit 213C is configured to generate the third internal command signal CAMSTD3 in response to the second internal command signal CAMSTD2 and a third control signal RE3 (i.e., the output signal of the third delay unit 213D). The third delay unit 213D is configured to delay the third internal command signal CAMSTD3 and to generate the third control signal RE3.

The signal generation unit 220 is configured to generate the internal ready/busy signal int R/B using the internal command signals CAMSTD1 to CAMSTD3 generated by the delay circuits 211 to 212. The signal generation unit 220 can be formed of a NOR gate.

The internal ready/busy signal int R/B is used to generate internal control signals for use when the internal circuit of a device is operated. In this embodiment of the present invention, the internal ready/busy signal int R/B is used to control the CAM reset signal RST_CAM and the reset signal RST used in an initial operation in the CAM cell read circuit 100 of a semiconductor memory device.

Figure 3:
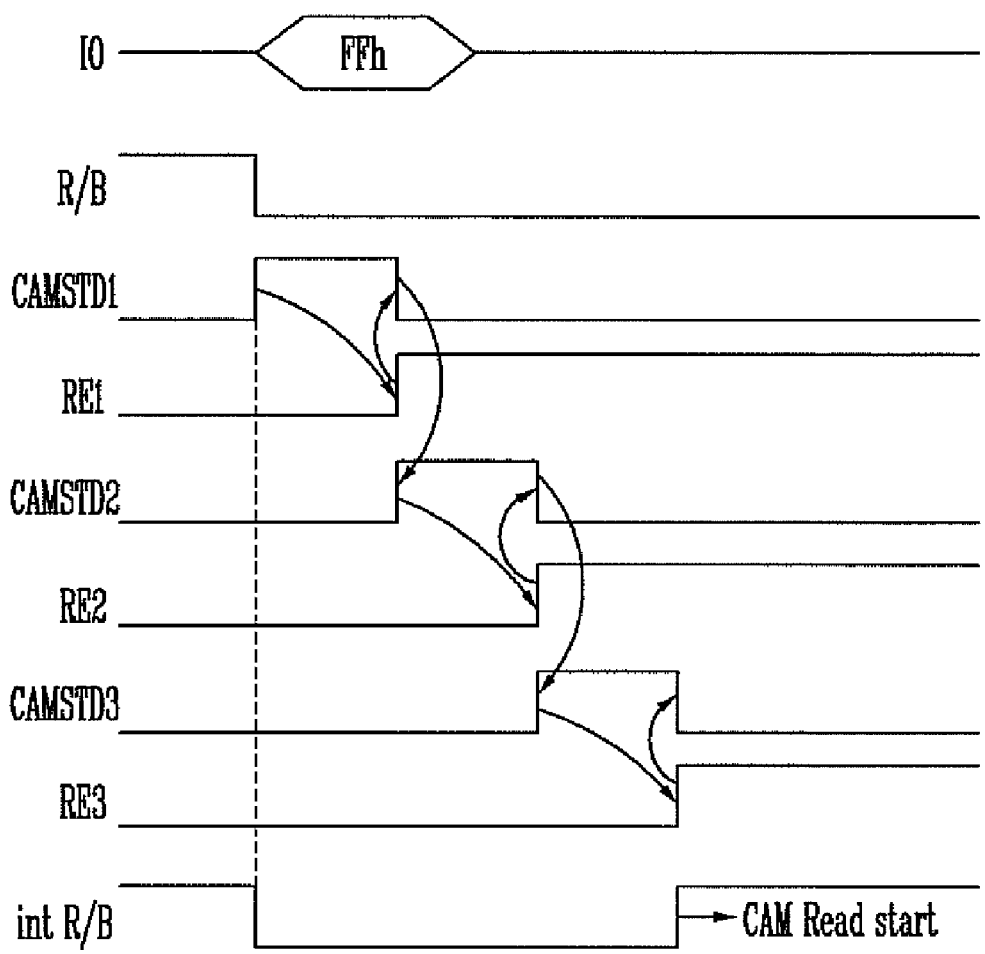
FIG. 3 is a signal waveform diagram illustrating the operation of the CAM cell read control circuit 200 shown in FIG. 2.

FIG. 3 is a signal waveform diagram illustrating the operation of the CAM cell read control circuit 200 shown in FIG. 2. FIG. 4 is a flowchart illustrating a method of reading a CAM cell of a semiconductor memory device.

The method of reading data stored in the CAM cell of a semiconductor memory device according to an embodiment of the present invention is described with reference to FIGS. 1 to 4.

First, after a passage of a set time period after a power supply voltage was initially supplied to the semiconductor memory device, a ready/busy signal R/B is output. The externally input reset signal FFh is then inputted to the device at step 410.

A determination is then made as to whether the externally input reset signal FFh is a first externally input reset signal FFh at step 420. That is, a determination is made as to whether the externally input reset signal FFh has been inputted to the device for the first time after the power supply voltage has been initially supplied to the device. If, as a result of the determination at step S420, the externally input reset signal FFh is determined not to be the first externally input reset signal FFh, an operation of reading data stored in a CAM cell is performed because the power supply voltage has not been inputted to the device for the first time.

However, if, as a result of the determination at step S420, the externally input reset signal FFh is determined to be the first externally input reset signal FFh, the CAM cell read control circuit 200 delays the externally input reset signal FFh and generates an internal command signal CAMSTD at step 430. The CAM cell read control circuit 200 then determines the order in which the internal command signal CAMSTD has been generated with respect to the internal command signals CAMSTD at step 440. In other words, the CAM cell read control circuit 200 determines whether the generated internal command signal CAMSTD is an $N^{th}$ internal command signal CAMSTD by counting the generated internal command signal CAMSTD (i.e., whether it is a first generated internal command signal CAMSTD1 or a second internal command signal CAMSTD2). In the embodiment of the present invention, N can be set to 3 because the three delay circuits 211 to 212 are used.

If, as a result of the determination at step 440, the generated internal command signal CAMSTD is determined to be an internal command signal CAMSTD (i.e., the internal command signal CAMSTD1 or CAMSTD2) less than the $N^{th}$ internal command signal CAMSTD, the process returns to the step 430, and the above processes are repeated until the internal command signal CAMSTD becomes the third command signal CAMSTD3.

However, if, as a result of the determination at step 440, the generated internal command signal CAMSTD is determined to be the $N^{th}$ internal command signal CAMSTD (i.e., the third internal command signal CAMSTD3), the internal command signals CAMSTD1 to CAMSTD3 are logically combined to generate the internal ready/busy signal int R/B, and the operation of reading data stored in a CAM cell is performed at step 450.

The operation of reading data stored in a CAM cell is described in more detail below.

First, the reset signal RST and the CAM reset signal RST_CAM respectively supplied to the CAM cell data output unit 120 and the CAM cell latch unit 110 are generated in response to the internal ready/busy signal int R/B.

The reset signal RST is supplied to the CAM cell data output unit 120 to reset the output node B to a low level. The CAM reset signal RST_CAM is supplied to the CAM cell latch unit 110 to reset the node Q to a low level.

The enable signal EN is then supplied to the CAM cell latch unit 110 to supply the ground voltage Vss to the node A. Thereafter, either of the data load signals DATALOAD and DATALOAD_L corresponding to data stored in a CAM cell is enabled to supply the ground voltage Vss to either the node Q or the node Qb. Accordingly, data are stored in the latch consisting of the inverters IV1 and IV2.

Therefore, the NMOS transistor NM6 of the CAM cell data output unit 120 is turned on or off in response to the voltage level of the node Q (i.e., the latch data CAM), to control the voltage level of the output node B.

As described above, when the externally input reset signal FFh is supplied to the semiconductor memory device, a determination is made as to whether the externally input reset signal FFh is a first input reset signal. If the externally input reset signal FFh is determined to be the first input reset signal, the externally input reset signal FFh is delayed for a set time period, and the internal ready/busy signal is generated in response to the delayed externally input reset signal FFh. The operation of resetting the CAM cell read circuit is then performed in response to the internal ready/busy signal. Accordingly, although a power supply voltage slowly rises when the device first operates, stable operation of the device is effected because the operation of resetting the CAM cell read circuit is performed slowly after a delay time period has elapsed as compared with a conventional reset operation.

As described above, according to the embodiment of the present invention, when a reset signal is inputted to a semiconductor memory device, a determination is made as to whether the reset signal is a first reset signal. If the reset signal is determined to be the first reset signal, then the reset signal is delayed for a set time delay period using the CAM cell read control circuit, and data stored in a CAM cell are read using the CAM cell latch. Although a power supply voltage slowly rises when the device is first operated, data stored in a CAM cell is correctly read.

What is claimed is:

1. A Code Address Memory (CAM) cell read control circuit of a semiconductor memory device, the circuit comprising:
    a first circuit having a first codec configured to generate a first internal command signal that maintains a high level in response to a first external input reset signal that is inputted to the semiconductor memory device after a power-on and a first delay circuit configured to receive and delay the first internal command signal and change the first internal command signal to a low level from the high level;
    a second circuit having a second codec configured to generate a second internal command signal that maintains a high level in response to the first internal command signal and a second delay circuit configured to receive and delay the first internal command signal and change the first internal command signal to a low level from the high level;
    a signal generation unit configured to generate an internal ready/busy signal when the first internal command signal and the second internal command signal have a low level;
    a CAM cell read circuit configured to start a read operation for reading a data stored in a CAM cell in response to the internal ready/busy signal.

2. A Code Address Memory (CAM) cell read control circuit of a semiconductor memory device, the circuit comprising:
    a CAM cell read circuit configured to read data stored in a CAM cell and to output the read data;
    an internal delay circuit configured to generate a plurality of internal command signals by delaying a first external input reset signal; and
    a signal generation unit configured to generate an internal ready/busy signal to reset the CAM cell read circuit in response to the internal command signals,
    wherein the internal delay circuit comprises:
    a first delay circuit configured to generate a first internal command signal in response to the external input reset signal and a first feedback signal;
    a second delay circuit configured to generate a second internal command signal in response to the first internal command signal and a second feedback signal; and
    a third delay circuit configured to generate a third internal command signal in response to the second internal command signal and a third feedback signal.

3. The CAM cell read control circuit of claim 2, wherein the CAM cell read circuit comprises:
    a CAM cell latch unit configured to temporarily store the data stored in the CAM cell; and
    a CAM cell data output unit configured to output the read data according to a value of the data stored in the CAM cell latch unit.

4. The CAM cell read control circuit of claim 3, wherein the CAM cell latch unit and the CAM cell data output unit are reset in response to the internal ready/busy signal generated after a set delay time period after the externally input reset signal has been inputted.

5. The CAM cell read control circuit of claim 2, wherein the first delay circuit comprises:
    a first decoder configured to generate the first internal command signal in response to the external input reset signal and the first feedback signal; and a first delay unit configured to delay the first internal command signal and to output the first feedback signal.

6. The CAM cell read control circuit of claim 2, wherein the second delay circuit comprises:
   a second decoder configured to generate the second internal command signal in response to the first internal command signal and the second feedback signal; and
   a second delay unit configured to delay the second internal command signal and to output the second feedback signal.

7. The CAM cell read control circuit of claim 2, wherein the third delay circuit comprises:
   a third decoder configured to generate the third internal command signal in response to the second internal command signal and the third feedback signal; and
   a third delay unit configured to delay the third internal command signal and to output the third feedback signal.

* * * * *